(12) United States Patent
Kaneko

(10) Patent No.: US 12,532,643 B2
(45) Date of Patent: Jan. 20, 2026

(54) DISPLAY DEVICE

(71) Applicant: SHARP KABUSHIKI KAISHA, Sakai (JP)

(72) Inventor: Toshihiro Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 407 days.

(21) Appl. No.: 18/275,283

(22) PCT Filed: Feb. 12, 2021

(86) PCT No.: PCT/JP2021/005334
§ 371 (c)(1),
(2) Date: Aug. 1, 2023

(87) PCT Pub. No.: WO2022/172411
PCT Pub. Date: Aug. 18, 2022

(65) Prior Publication Data
US 2024/0107860 A1 Mar. 28, 2024

(51) Int. Cl.
*H10K 59/80* (2023.01)
*H10K 59/124* (2023.01)

(52) U.S. Cl.
CPC ......... *H10K 59/873* (2023.02); *H10K 59/124* (2023.02); *H10K 59/8731* (2023.02)

(58) Field of Classification Search
CPC . H10K 59/873; H10K 59/8731; H10K 59/124
See application file for complete search history.

(56) References Cited

U.S. PATENT DOCUMENTS

| | | | |
|---|---|---|---|
| 10,909,930 B2* | 2/2021 | Kim | G02F 1/136286 |
| 11,469,400 B2* | 10/2022 | Seo | H10K 59/873 |
| 2018/0069071 A1* | 3/2018 | Furuie | H10K 77/111 |
| 2019/0214600 A1* | 7/2019 | Park | H10K 59/8731 |
| 2019/0288047 A1* | 9/2019 | Jeong | H10K 77/10 |
| 2020/0006700 A1* | 1/2020 | Kim | H10K 50/8426 |
| 2022/0052142 A1* | 2/2022 | Kim | H10K 59/121 |
| 2024/0040891 A1* | 2/2024 | Park | G06F 3/0412 |

FOREIGN PATENT DOCUMENTS

JP 2010-014475 A 1/2010

\* cited by examiner

*Primary Examiner* — Mary Ellen Bowman
(74) *Attorney, Agent, or Firm* — ScienBiziP, P.C.

(57) ABSTRACT

A display device includes: a substrate layer including a second resin substrate layer provided on an inorganic substrate layer; a light-emitting element layer provided above the second resin substrate layer; and a sealing film provided on the light-emitting element layer. A through hole is included in a non-display region and formed in a thickness direction of the substrate layer. In the non-display region, a recess portion is formed around the through hole of the second resin substrate layer. The resin substrate layer has an end face facing inside the recess portion, and the end face includes an inclined end face. The inorganic sealing layer extends into the recess portion to cover the inclined end face, and comes into contact with the inorganic substrate layer in the recess portion. The inorganic sealing layer has an end face toward the through hole, and the end face is positioned apart from a peripheral edge of the through hole.

9 Claims, 9 Drawing Sheets

DISPLAY DEVICE

TECHNICAL FIELD

The present disclosure relates to a display device.

BACKGROUND ART

In recent years, light-emitting organic electroluminescence (EL) display devices using organic EL elements have attracted attention as a replacement for liquid crystal display devices. For these organic EL display devices, a structure is proposed as follows: An island-shaped non-display region is provided inside a display region for presenting an image, so that an electronic component such as a camera or a fingerprint sensor is installed in the non-display region. The non-display region is provided with a through hole along its thickness.

For example, Patent Document 1 discloses, as an organic EL display device, a light-emitting panel for a pointer plate. The light-emitting panel has a center hole formed as a through hole through which a driving shaft of a pointer is inserted. This light-emitting panel includes: an overcoat layer provided over a transparent substrate and covering a thin-film transistor (hereinafter referred to as TFT); and a reverse-tapered partition wall shaped into an annular shape and provided on the overcoat layer around the center hole. This partition wall divides an electrode, which is provided on the overcoat layer, into a display region outside the partition wall and a non-display region inside the partition wall. Thus, even if the electrode in the non-display region deteriorates, and the deterioration progresses from a portion of the electrode exposed to an inner peripheral surface of the center hole, the partition wall keeps the deterioration from propagating to a portion of the electrode in the display region, thereby preventing damage to an organic EL element.

Citation List

Patent Literature

[Patent Document 1] Japanese Unexamined Patent Application Publication No. 2010-014475

SUMMARY OF INVENTION

Technical Problems

In the light-emitting panel of Patent Document 1, the overcoat layer is made of an inorganic insulating material such as silicon nitride. If the light-emitting panel includes a transparent substrate formed of a flexible sheet, the flexible sheet is made of an organic insulating material such as polyimide resin. In this case, water enters at the inner peripheral surface of the center hole between the transparent substrate and the overcoat layer. The water thus entered runs along an interface between the transparent substrate and the overcoat layer, and reaches the display region outside the partition wall. This water might cause deterioration of an organic EL element.

A technique of the present disclosure is related to a display device provided with a non-display region inside a display region. The technique sets out to keep water from entering the display region through a through hole formed in the non-display region.

Solution to Problems

A technique of the present disclosure is directed to a display device including: a substrate layer including an inorganic substrate layer and a resin substrate layer provided on the inorganic substrate layer; a light-emitting element layer provided above the resin substrate layer and including a plurality of light-emitting elements; and a sealing film including an inorganic sealing layer provided to cover the plurality of light-emitting elements. The display device according to the technique of the present disclosure includes: a display region that displays an image with light emitted from the light-emitting elements, and a non-display region positioned inside the display region and shaped into an island. A through hole is included in the non-display region and formed in a thickness direction of the substrate layer. In the non-display region, a recess portion is formed around the through hole of the resin substrate layer to expose the inorganic substrate layer on a bottom of the recess portion. The resin substrate layer has an end face facing inside the recess portion, the end face including an inclined end face inclined and positioned closer to the through hole toward the inorganic substrate layer. The inorganic sealing layer extends from the display region into the recess portion to cover the inclined end face in the non-display region, and comes into contact with the inorganic substrate layer in the recess portion. The inorganic sealing layer has an end face toward the through hole, the end face being positioned apart from a peripheral edge of the through hole.

Advantageous Effect of Invention

A technique of the present disclosure is related to a display device provided with a non-display region inside a display region. The technique can keep water from entering the display region through a through hole formed in the non-display region.

BRIEF DESCRIPTION OF DRAWINGS

FIG. 10 corresponds to FIG. 8.

DESCRIPTION OF EMBODIMENT

Figure 1:
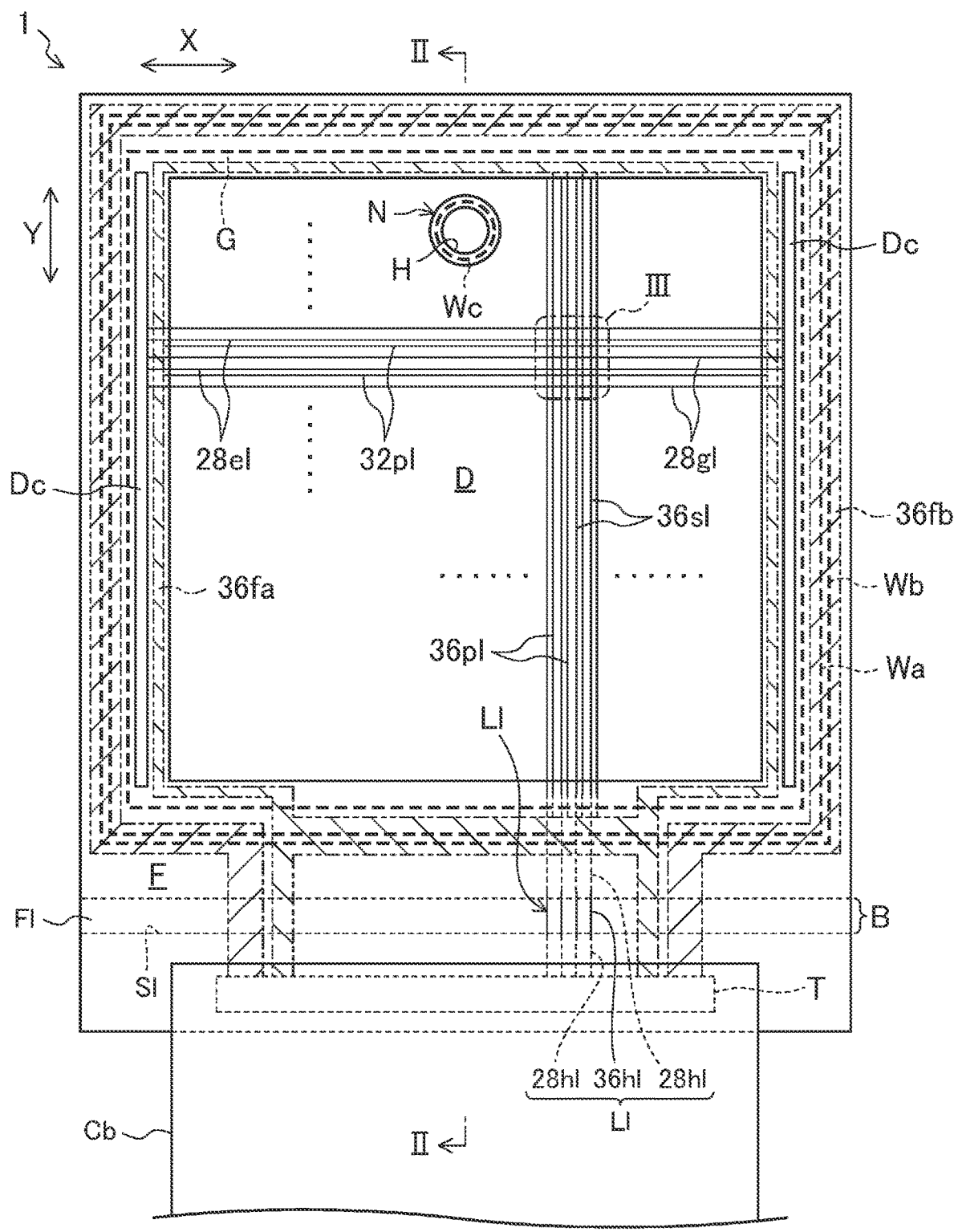
FIG. 1 is a plan view of a schematic configuration of an organic EL display device.

An exemplary embodiment will be described in detail below with reference to the drawings. In the embodiment below, an organic EL display device including an organic EL element is described as an example of a display device according to a technique of the present disclosure.

Note that the embodiment below includes a statement describing that, above a constituent feature such as a film, layer, or element, another constituent feature such as another film, layer or element is provided or formed. The statement means not only a case where the other constituent feature is found immediately above the constituent feature, but also a case where still another constituent feature such as still another film, layer, or element is provided between the constituent feature and the other constituent feature.

Moreover, the embodiment below includes a statement describing that a constituent feature such as a film, layer, or element is connected to another constituent feature such as another film, layer, or element. Such a statement means that the constituent features are electrically connected together unless otherwise specified. The statement includes not only a case of direct connection but also a case of indirect connection through still another constituent feature such as still another film, layer, or an element, unless otherwise departing from the scope of the present disclosure. Furthermore, the statement also includes a case where a constituent feature is integrated with another constituent feature, that is, a portion of a constituent feature constitutes another constituent feature.

In addition, the embodiment below includes a statement describing that a constituent feature such as a film, layer, or element is included in the same layer as a layer of another constituent feature such as another film, layer, or element. Such a statement means that both of the constituent features are formed in the same process. A statement describes that a constituent feature such as a film, layer, or element is provided below another constituent feature such as another film, layer, or element. Such a statement means that the constituent feature is formed in a process preceding the process of the other constituent feature. A statement describes that a constituent feature such as a film, layer, or element is provided above another constituent feature such as another film, layer, or element. Such a statement means that the constituent feature is formed in a process succeeding the process of the other constituent feature.

Moreover, the embodiment below includes a statement describing that a constituent feature such as a film, layer, or element is the same as, or identical to, another constituent feature such as another film, layer, or element. Such a statement means not only a case where the constituent feature is completely the same as, or completely identical to, the other constituent feature, but also a case where the constituent feature is substantially the same as, or substantially identical to, the other constituent feature within production variation and tolerance.

In addition, the embodiment describes such terms as "first", "second", and "third". These terms are used to distinguish between the phrases to which these terms are assigned, and shall not limit the number and the order of the phrases.

Embodiment

An organic EL display device 1 of this embodiment is used for various appliances such as displays of mobile devices including smart phones and tablet terminals, monitors of personal computers (PCs), and television devices. The organic EL display device 1 is combined with an electronic component Ec such as a camera, a fingerprint sensor, or a face recognition sensor. For example, the organic EL display device 1 is combined with a camera to constitute a camera-equipped display device capable of capturing the front side that displays an image.

Configuration of Organic EL Display Device

Figure 2:
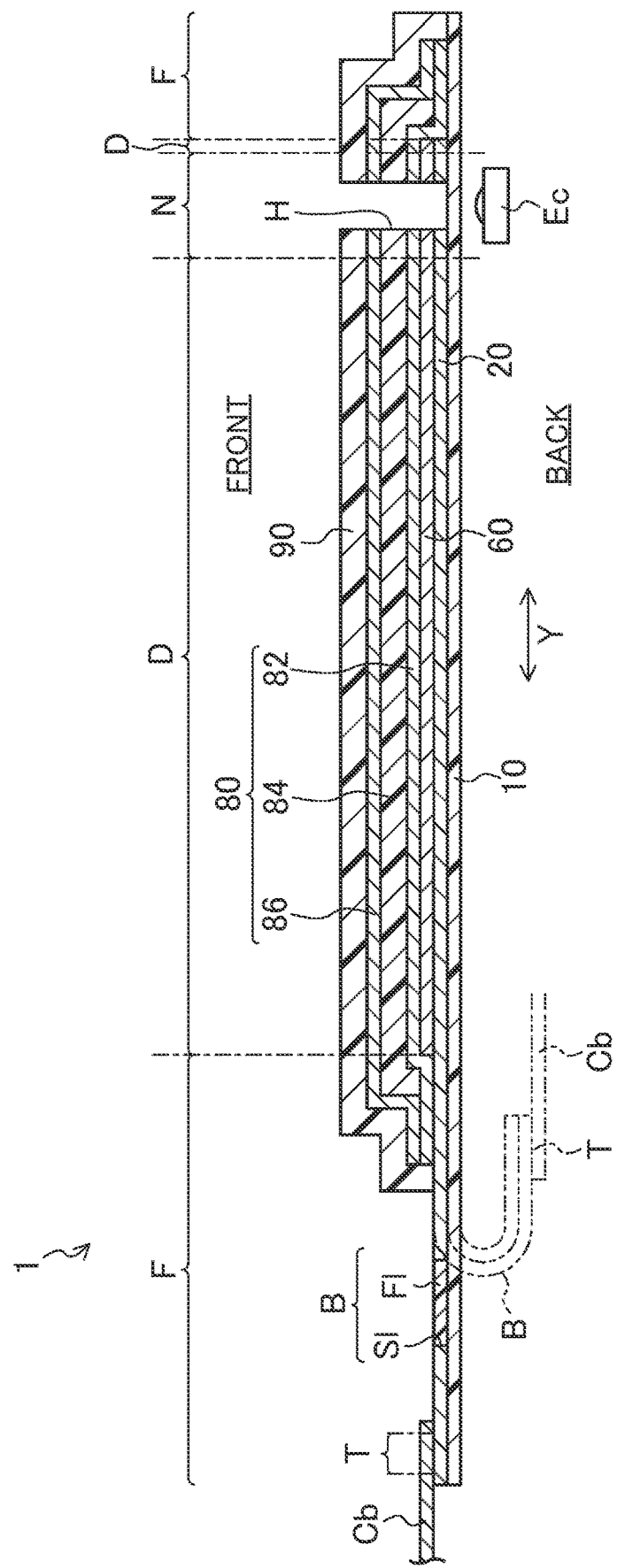
FIG. 2 is a cross-sectional view of the organic EL display device, taken along line II-II in FIG. 1. (Dash-dot-dot-dash lines represent the organic EL display device folded at a folding portion.)

Described below is a configuration of the organic EL display device 1 of this embodiment. As illustrated in FIGS. 1 and 2, the organic EL display device 1 includes: a display region D that displays an image; a picture-frame region F provided around the display region D; and a non-display region N provided inside the display region D.

Figure 3:
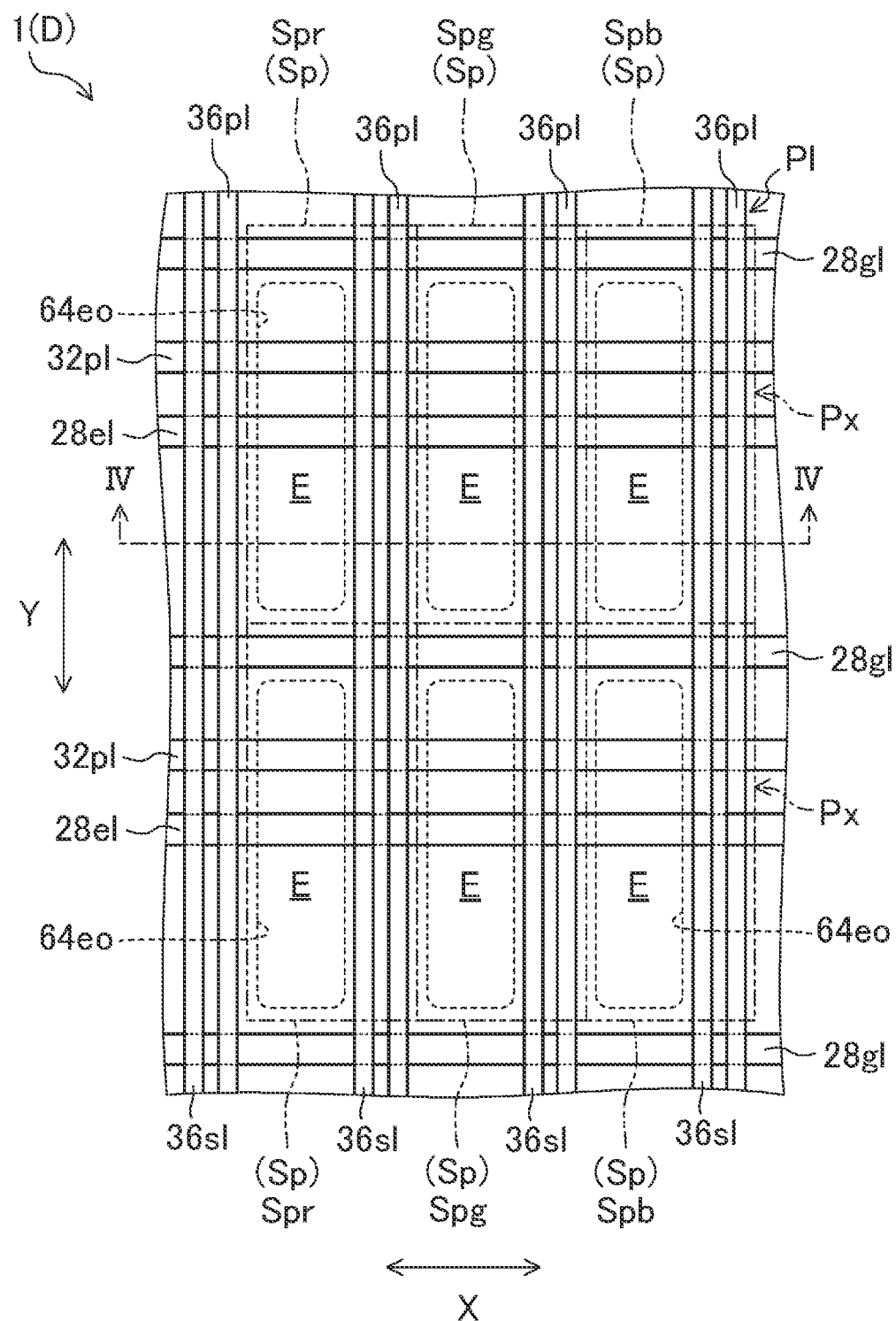
FIG. 3 is a plan view of pixels and various display wires included in a portion of the display region surrounded with line III in FIG. 1.

The display region D is a rectangular region serving as a screen. This embodiment discloses the display region D shaped into a rectangle as an example. The rectangle may include such substantial rectangles as a rectangle having at least one of the sides as an arc-like side, a rectangle having at least one of the corners as a rounded corner, and a rectangle having at least one of the sides as a partially notched side. As illustrated in FIG. 3, the display region D includes a plurality of pixels Px.

The plurality of pixels Px are arranged in a matrix. Each of the pixels Px includes three subpixels Sp. The three subpixels Sp include a subpixel Spr having a light-emitting region E that emits a red light, a subpixel Spg having a light-emitting region E that emits a green light, and a subpixel Spb having a light-emitting region E that emits a blue light. These three subpixels Sp are arranged, for example, in stripes.

As illustrated in FIGS. 1 and 2, the picture-frame region F is a rectangular frame-shaped region provided out of the screen and presenting no image. The picture-frame region F has one side provided with a terminal unit T to be connected to an external circuit. The picture-frame region F includes a folding portion B between the display region D and the terminal unit T. The folding portion B is foldable around a first direction X that is a horizontal direction in FIG. 1.

In the folding portion B, a slit S1 is formed in a multilayer stack (not shown in FIG. 2 for the sake of simplicity) made of a base coat film 22, a gate insulating film 26, a first interlayer insulating film 30, and a second interlayer insulating film 34. These films will be described later. The slit S1 is shaped into a groove penetrating the multilayer stack and running in a direction in which the folding portion B extends in order to expose a substrate layer 10. In the slit S1, a filler layer F1 is provided to fill the slit S1. The filler layer F1 is formed of an organic resin material such as polyimide resin, acrylic resin, or polysiloxane resin.

The terminal unit T is folded at the folding portion B at an angle of, for example, 180° (in a U-shape), and laid in back of the organic EL display device 1 (represented by the dash-dot-dot-dash line in FIG. 2). The terminal unit T is connected to a wiring board Cb such as a flexible printed circuit (FPC). The picture-frame region F is provided with a plurality of lead wires L1 led from the display region D to the terminal unit T. Each of the plurality of lead wires L1 is connected through the wiring board Cb to a display control circuit (not shown) at the terminal unit T.

In the picture-frame region F, a trench G is formed in a planarization film 38*pf* to be described later. The trench G is shaped into a frame to surround the display region D. The trench G may also be shaped into a substantially C-shape opening toward the terminal unit T in plan view. The trench G penetrates the planarization film 38*pf* and divides the planarization film 38*pf* into an inside and an outside of the picture-frame region F. The trench G prevents water from entering the display region D out of the picture-frame region F.

In the picture-frame region F, a drive circuit Dc including a gate driver and an emission driver is monolithically provided to each of the sides (the left and the right side in FIG. 1) adjacent to the side provided with the terminal unit T. The drive circuit Dc is disposed closer to the display region D than the trench G. The drive circuit Dc or a portion of the drive circuit Dc (the gate driver or the emission driver) may be disposed closer to the outer periphery of the frame region F than the trench G.

The picture-frame region F is provided with: a first picture-frame wire 36fa (hatched with diagonal lines in an upper left direction in FIG. 1 for the sake of simplicity); a second picture-frame wire 36fb (hatched with diagonal lines in an upper right direction in FIG. 1 for the sake of simplicity); a first dam wall Wa; and a second dam wall Wb.

The first picture-frame wire 36fa is shaped into a frame and provided closer to the display region D than the trench G and the drive circuit Dc. The first picture-frame wire 36fa runs under the trench G below the planarization film 38pf, and extends toward the terminal unit T. The first picture-frame wire 36fa is supplied with a high-level power source voltage (ELVDD) at the terminal unit T through the wiring board Cb.

The second picture-frame wire 36fb is shaped into a substantial C-shape and provided closer to the outer periphery of the picture-frame region F than the trench G and the drive circuit Dc. Opposing end portions of the second picture-frame wire 36fb extend toward the terminal unit T along the first picture-frame wire 36fa. The second picture-frame wire 36fb is supplied with a low-level power source voltage (ELVSS) at the terminal unit T through the wiring board Cb.

The first dam wall Wa is shaped into a frame and formed along an outer periphery of the trench G. The second dam wall Wb is shaped into a frame and formed along an outer periphery of the first dam wall Wa. In a process of producing the organic EL display device 1, an organic material is applied to form an organic sealing layer 84 included in a sealing film 80. The first dam wall Wa and the second dam wall Wb keep the organic material from spreading out of the picture-frame region F.

The non-display region N is shaped into an island. The non-display region N includes a through hole H formed in a thickness direction of a substrate layer 10 to be described later. The through hole H is formed so that the electronic component Ec such as, for example, a camera is installed on the back surface of the organic EL display device 1. The non-display region N and the through hole H have a similar shape; namely, for example, a circular shape. Each of the non-display region N and the through hole H may have another shape such as a rectangular shape. The non-display region N and the through hole H may have either a similar shape or different shapes.

The non-display region N is provided with a third dam wall Wc. The third dam wall Wc is shaped into a frame and formed around the through hole H. In a process of producing the organic EL display device 1, an organic resin material is applied to form the organic sealing layer 84. The third dam wall Wc keeps the organic material from spreading into an inside of the non-display region N.

Figure 4:
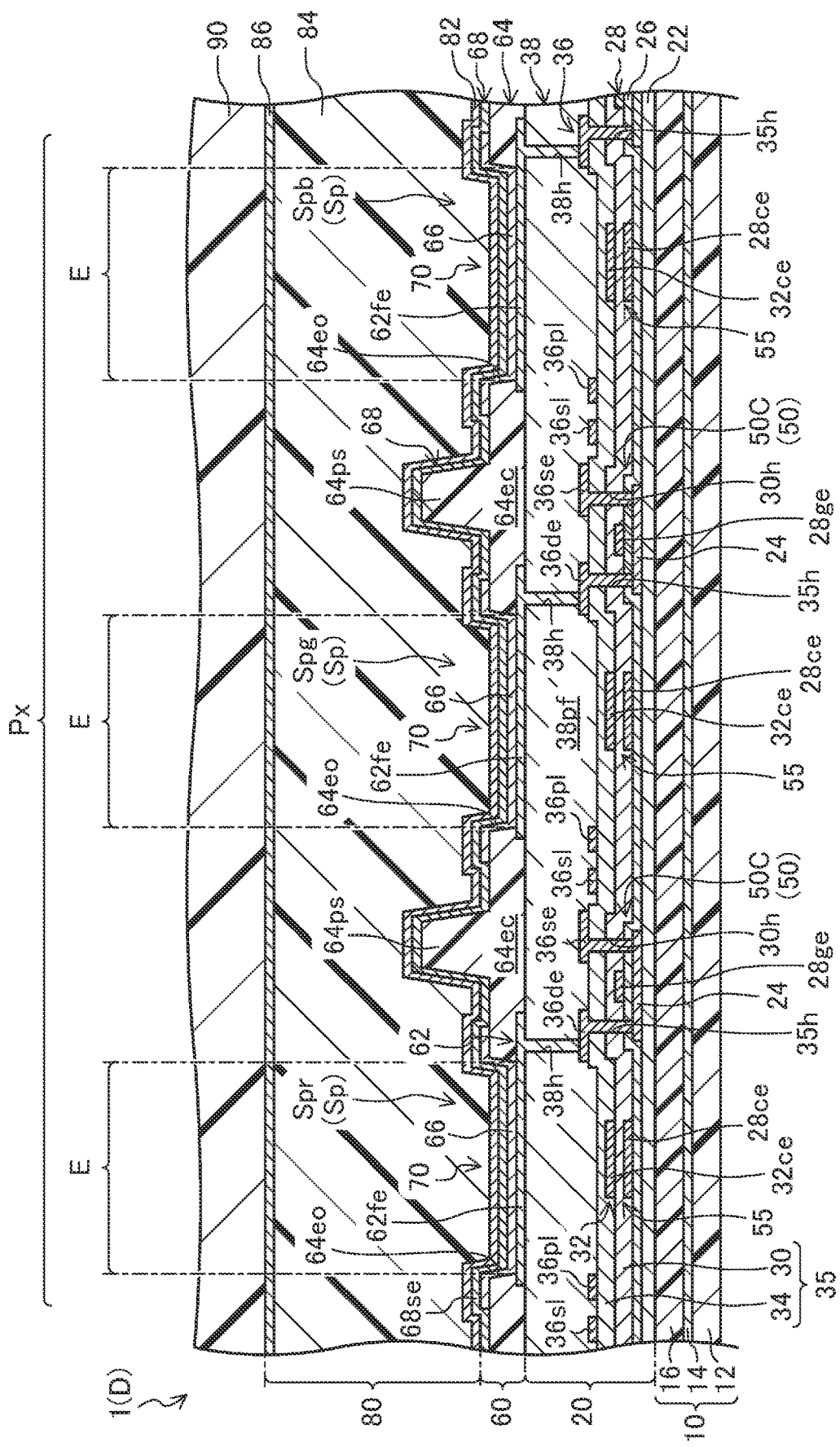
FIG. 4 is a cross-sectional view of the organic EL display device, taken along line IV-IV in FIG. 3.

The organic EL display device 1 is an active matrix display device in which a TFT 50 controls light to be emitted from each of the subpixels Sp. The TFT 50 operates to display an image. As illustrated in FIGS. 2 and 4, the organic EL display device 1 includes: the substrate layer 10; a TFT layer 20 provided on the substrate layer 10; a light-emitting element layer 60 provided on the TFT layer 20; and the sealing film 80 provided on the light-emitting element layer 60.

Substrate Layer

The substrate layer 10 is a base layer of a panel forming the organic EL display device 1. The substrate layer 10 is flexible. The substrate layer 10 includes: a first resin substrate layer 12; an inorganic substrate layer 14; and a second resin substrate layer 16. The first resin substrate layer 12 is positioned across from the TFT layer 20. The second resin substrate layer 16 is positioned closer to the TFT layer 20. The inorganic substrate layer 14 is provided between the first resin substrate layer 12 and the second resin substrate layer 16.

The first resin substrate layer 12 and the second resin substrate layer 16 are formed of an organic insulating material such as, for example, polyimide resin. The inorganic substrate layer 14 is formed of at least one inorganic insulating material selected from, for example, silicon nitride, silicon oxide, and silicon oxynitride. The inorganic substrate layer 14 is a monolayer film or a multilayer film made of such inorganic insulating materials. To a back surface of the substrate layer 10 (the first resin substrate layer 12), a protective film (not shown) is attached.

TFT Layer

The TFT layer 20 includes a plurality of the TFTs 50. The TFT layer 20 includes: the base coat film 22; a semiconductor layer 24; the gate insulating film 26; a first conductive layer 28; the first interlayer insulating film 30; a second conductive layer 32; the second interlayer insulating film 34; a third conductive layer 36; and a first resin layer 38; all of which are provided on top of another in the stated order above the substrate layer 10.

The base coat film 22 is provided over a substantially entire surface of the substrate layer 10. The base coat film 22 is formed of at least one inorganic insulating material selected from, for example, silicon oxide, silicon nitride, and silicon oxynitride. The base coat film 22 is a monolayer film or a multilayer film made of such inorganic insulating materials.

The semiconductor layer 24 includes a plurality of semiconductor layers 24 each shaped into an island and provided on the base coat film 22. Each semiconductor layer 24 is formed of, for example, low-temperature polycrystalline silicon (LTPS). The semiconductor layer 24 may be formed of an oxide semiconductor such as indium gallium zinc oxide (In—Ga—Zn—O), or of another semiconductor material.

The gate insulating film 26 is continuously provided on the base coat film 22 to cover the plurality of semiconductor layers 24. The gate insulating film 26 is formed of, for example, at least one inorganic insulating material selected from silicon oxide, silicon nitride, and silicon oxynitride. The gate insulating film 26 is a monolayer film or a multilayer film made of such inorganic insulating materials. The gate insulating film 26 may be shaped into an island and provided on each semiconductor layer 24.

The first conductive layer 28 is provided on the gate insulating film 26. The first conductive layer 28 includes: a plurality of gate wires 28gl; a plurality of emission control wires 28el; a plurality of first partial wires 28hl; a plurality of gate electrodes 28*ge*; and a plurality of first capacitive electrodes 28*ce*. These various wires and electrodes are formed of the same material and in the same layer. Exemplary materials of these various wires and electrodes include such conductive materials as aluminum (Al), tungsten (W), molybdenum (Mo), tantalum (Ta), chromium (Cr), titanium (Ti), chromium (Cr), titanium (Ti), and copper (Cu). These various wires and electrodes are monolayer films or multilayer films made of such conductive materials.

The first interlayer insulating film 30 is provided on the gate insulating film 26 to cover the plurality of gate wires 28*gl*, the plurality of emission control wires 28*el*, the plurality of first partial wires 28*hl*, the plurality of gate electrodes 28*ge*, and the plurality of first capacitive electrodes 28*ce*. The first interlayer insulating film 30 is formed of at least one inorganic insulating material selected from silicon oxide, silicon nitride, and silicon oxynitride. The first interlayer insulating film 30 is a monolayer film or a multilayer film made of such inorganic insulating materials.

The second conductive layer 32 is provided on the first interlayer insulating film 30. The second conductive layer 32 includes: a plurality of first power source wires 32*pl*; and a plurality of second capacitive electrodes 32*ce*. These first power source wires 32*pl* and second capacitive electrodes 32*ce* are formed of the same material and in the same layer. Exemplary materials of these first power source wires 32*pl* and second capacitive electrodes 32*ce* include such conductive materials as aluminum (Al), tungsten (W), molybdenum (Mo), tantalum (Ta), chromium (Cr), titanium (Ti), chromium (Cr), titanium (Ti), and copper (Cu). These first power source wires 32*pl* and second capacitive electrodes 32*ce* are monolayer films or multilayer films made of such conductive materials.

The second interlayer insulating film 34 is provided on the first interlayer insulating film 30 to cover the plurality of first power source wires 32*pl* and the plurality of second capacitive electrodes 32*ce*. The second interlayer insulating film 34 is formed of at least one inorganic insulating material selected from silicon oxide, silicon nitride, and silicon oxynitride. The second interlayer insulating film 34 is a monolayer film or a multilayer film made of such inorganic insulating materials. The first interlayer insulating film 30 and the second interlayer insulating film 34 constitute an interlayer insulating film 35.

The third conductive layer 36 is provided on the second interlayer insulating film 34. The third conductive layer 36 includes: a plurality of source wires 36*sl*; a plurality of source electrodes 36*se*; a plurality of drain electrodes 32*de*; a plurality of second power source wires 36*pl*; a plurality of second partial wires 36*hl*; the first picture-frame wire 36*fa*; and the second picture-frame wire 36*fb*. These various wires and electrodes are formed of the same material and in the same layer. Exemplary materials of these various wires and electrodes include such conductive materials as aluminum (Al), tungsten (W), molybdenum (Mo), tantalum (Ta), chromium (Cr), titanium (Ti), chromium (Cr), titanium (Ti), and copper (Cu). These various wires and electrodes are monolayer films or multilayer films made of such conductive materials.

The first resin layer 38 is provided on the second interlayer insulating film 34 and positioned above the third conductive layer 36. The first resin layer 38 includes: the planarization film 38*pf*; and a first wall layer (not shown). These planarization film 38*pf* and the first wall layer are formed of the same material and in the same layer. These planarization film 38*pf* and the first wall layer are formed of a resin material such as polyimide resin, or acrylic resin.

The planarization film 38*pf* is provided in the display region D toward the inner periphery of the picture-frame region F, in order to cover the plurality of source wires 36*sl*, the plurality of source electrodes 36*se*, the plurality of drain electrodes 36*de*, the plurality of second power source wires 36*pl*, the plurality of second partial wires 36*hl*, and the first picture-frame wire 36*fa*. The planarization film 38*pf* planarizes a surface of the TFT layer 20 to reduce influence of surface profiles of the various wires and electrodes, and, further, each of the TFTs 50.

The first wall layer includes two first wall layers provided toward the outer periphery of the planarization film 38*pf* in the picture-frame region F. One of the first wall layers is included the first dam wall Wa, and another one of the first wall layers is included in the second dam wall Wb. The one first wall layer as the first dam wall Wa is provided to the outer periphery of the planarization film 38*pf*, and spaced apart from the planarization film 38*pf*. The other first wall layer as the second dam wall Wb is provided to the outer periphery of the one first wall layer as the first dam wall Wa, and spaced apart from the first dam wall Wa.

Various Wires

As illustrated in FIGS. 1 and 3, in the display region D, the plurality of gate wires 28*gl* are spaced apart from one another in a second direction Y (a vertical direction in FIG. 1) perpendicular to a first direction X, and extend in parallel with one another in the first direction X. Each of the gate wires 28*gl* is a display wire to transmit a gate signal. A gate wire 28*gl* is provided for each row of the subpixels Sp. Each gate wire 28*gl* is connected to the gate driver of the drive circuit Dc. The gate wires 28*gl* are activated when selected by the gate driver at a predetermined time point.

In the display region D, the plurality of emission control wires 28*el* are spaced apart from one another in the second direction Y, and extend in parallel with one another in the first direction X. Each of the emission control wires 28*el* is a display wire to transmit an emission control signal. An emission control wire 28*el* is provided for each row of the subpixels Sp. Each emission control wire 28*el* is connected to the emission driver of the drive circuit Dc. The emission control wires 28*el* are deactivated when sequentially selected by the emission driver at a predetermined time point.

In the display region D, the plurality of source wires 36*sl* are spaced apart from one another in the first direction X, and extend in parallel with one another in the second direction Y. Each of the source wires 36*sl* is a display wire to transmit a source signal. A source wire 36*sl* is provided for each column of the subpixels Sp. Each source wire 36*sl* is connected to a lead wire L1. Each source wire 36*sl* is connected to the display control circuit through the terminal unit T.

In the display region D, the plurality of first power source wires 32*pl* are spaced apart from one another in the second direction Y, and extend in parallel with one another in the first direction X. In the display region D, the plurality of second power source wires 36*pl* are spaced apart from one another in the first direction X, and extend in parallel with one another in the second direction Y. Each of the first power source wires 32*pl* and the second power source wires 36*pl* is a display line to apply a predetermined high-level power source voltage (ELVDD).

The first power source wires 32*pl* and the second power source wires 36*pl* are arranged in a grid as a whole, and form a power source wire PI. The first power source wires 32*pl* are connected to the corresponding second power source wires 36pl and the first picture-frame wire 36fa through contact holes (not shown) formed in the second interlayer insulating film 34. Each of the second power source wires 36pl is connected to the first picture-frame wire 36fa.

In the picture-frame region F, the plurality of first partial wires 28hl have one portion provided between the display region D and the folding portion B, and another portion provided between the folding portion B and the terminal unit T. The portions are spaced apart from each other in the first direction X, and extend in parallel with each other in the second direction Y. Each of the first partial wires 28hl, which is positioned closer to the display region D than the folding portion B, is connected to a corresponding one of the source wires 36sl through a contact hole (not shown) formed in the interlayer insulating film 35. Each first partial wire 28hl constitutes a portion of the lead wire L1.

In the picture-frame region F, the plurality of second partial wires 36hl are provided on the filler layer F1 to cross the folding portion B, spaced apart from one another in the first direction X, and laid in parallel with one another in the second direction Y. Each second partial wire 36hl is connected through a contact hole (not shown) formed in the interlayer insulating film 35 to a corresponding first partial wire 28hl positioned closer to the display region D than the folding portion B and to a corresponding first partial wire 28hl positioned closer to the terminal unit T than the folding portion B. Each second partial wire 36hl, together with the first partial wire 28hl, constitutes the lead wire L1.

Various Electrodes

Two or more of the gate electrodes 28ge, two or more of the source electrodes 36se, and two or more of the drain electrodes 36de are provided for each of the subpixels Sp. A gate electrode 28ge, a source electrode 36se and a drain electrode 36de constitute a TFT 50. At least one first capacitive electrode 28ce and at least one second capacitive electrode 32ce are provided for each of the subpixels Sp. The first capacitive electrode 28ce and the second capacitive electrode 32ce constitute a capacitor 55.

TFT

Two or more of the TFTs 50 are provided for each of the subpixels Sp. Any of the plurality of TFTs 50 is a top gate TFT. Each TFT 50 includes: the semiconductor layer 24; the gate insulating film 26; the gate electrode 28ge; the interlayer insulating film 35; the source electrode 36se; and the drain electrode 36de. The source electrode 36se and the drain electrode 36de are: separated from each other; positioned to sandwich a region (an intrinsic region) included in the semiconductor layer 24 and overlapping with the gate electrode 28ge; and connected to different portions (conduction regions) of the semiconductor layer 24 through a contact hole 35h formed in the interlayer insulating film 35.

Capacitor

At least one capacitor 55 is provided for each of the subpixels Sp. The capacitor 55 is an element for holding data. The capacitor 55 includes: the first capacitive electrode 28ce; the first interlayer insulating film 30; and the second capacitive electrode 32ce. The first capacitive electrode 28ce and the second capacitive electrode 32ce overlap with each other through the first interlayer insulating film 30.

Light-Emitting Element Layer

The light-emitting element layer 60 is provided above the substrate layer 10 (the second resin substrate layer 16) through the TFT layer 20. The light-emitting element layer 60 includes a plurality of organic EL elements 70. The organic EL elements 70 are an example of light-emitting elements. The light-emitting element layer 60 includes: a fourth conductive layer 62; a second resin layer 64; an organic EL layer (an organic electroluminescence layer) 66; and a fifth conductive layer 68, all of which are provided in the stated order above the planarization film 38pf.

The fourth conductive layer 62 is positioned above the first resin layer 38. The fourth conductive layer 62 includes a plurality of first electrodes 62fe. The first electrodes 62fe are provided to the respective subpixels Sp (the respective organic EL elements 70). Each of the first electrodes 62fe functions as an anode to inject holes into the organic EL layer 66. The first electrode 62fe is reflective to light.

Exemplary materials of the first electrode 62fe include conductive materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn).

Furthermore, the first electrode 62fe may be formed of an alloy of astatine (At) and astatine oxide ($AtO_2$). Moreover, the first electrode 62fe may be formed of a conductive oxide such as tin oxide (SnO), zinc oxide (ZnO), indium tin oxide (ITO), or indium zinc oxide (IZO). The first electrode 62fe is preferably formed of a material having a large work function, to improve efficiency in injection of the holes into the organic EL layer 66. The first electrode 62fe may be a multilayer including a plurality of layers made of the above materials.

The second resin layer 64 includes: an edge cover 64ec; a photo spacer 64ps; and a second wall layer (not shown). The edge cover 64ec, the photo spacer 64ps, and the second wall layer are formed in the same layer and of the same material. Exemplary materials of the edge cover 64ec, the photo spacer 64ps, and the second wall layer include resin materials such as polyimide resin, acrylic resin, polysiloxane resin, and novolak resin.

The edge cover 64ec partitions adjacent first electrodes 62fe. The edge cover 64ec is formed in a grid pattern as a whole, and covers a peripheral edge portion of each first electrode 62fe. The edge cover 64ec includes an opening 64eo formed to expose the first electrode 62fe. The edge cover 64ec has a surface partially forming a plurality of the photo spacers 64ps protruding upwards. Although not shown, the plurality of photo spacers 64ps are also provided in the frame region F in a predetermined arrangement. The second wall layer is divided into two second wall layers in the picture-frame region F, and provided on the respective first wall layers. One of the second wall layers is included in the first dam wall Wa, and another one of the second wall layers is included in the second dam wall Wb.

Organic EL Layer

Figure 5:
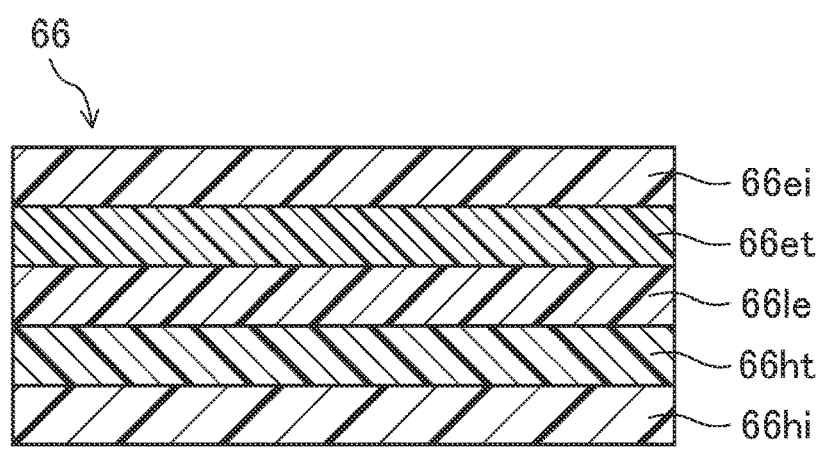
FIG. 5 is a cross-sectional view of a multilayer structure of an organic EL layer included in the organic EL display device.

The organic layer 66 is an example of a light-emitting functional layer. The organic EL layer 66 is provided on an individual first electrode 62fe in each opening 64eo of the edge cover 64ec. As illustrated in FIG. 5, the organic EL layer 66 includes: a hole injection layer 66hi; a hole transport layer 66ht; a light-emitting layer 66le, an electron transport layer 66et; and an electron injection layer 66ei, all of which are provided in the stated order above the first electrode 62*fe*. One or more of the hole injection layer 66*hi*, the hole transport layer 66*ht*, the light-emitting layer 66*le*, the electron transport layer 66*et*, and the electron injection layer 66*ei* may be monolithically provided in common to the plurality of subpixels Sp.

The hole injection layer 66*hi* is also referred to as an anode buffer layer. The hole injection layer 66*hi* brings energy levels of the first electrode 62*fe* and the organic EL layer 66 closer to each other to improve efficiency in injection of the holes from the first electrode 62*fe* to the organic EL layer 66. Exemplary materials of the hole injection layer 66*hi* include: a triazole derivative; an oxadiazole derivative; an imidazole derivative; a polyarylalkane derivative; a pyrazoline derivative; a phenylenediamine derivative; an oxazole derivative; a styrylanthracene derivative; a fluorenone derivative; a hydrazone derivative; and a stilbene derivative.

The hole transport layer 66*ht* efficiently moves the holes to the light-emitting layer 66*le*. Exemplary materials of the hole transport layer 66*ht* include: a porphyrin derivative; an aromatic tertiary amine compound; a styrylamine derivative; polyvinyl carbazole; poly-p-phenylenevinylene; polysilane; a triazole derivative; an oxadiazole derivative; an imidazole derivative, a polyarylalkane derivative; a pyrazoline derivative; a pyrazolone derivative; a phenylenediamine derivative; an arylamine derivative; an amine-substituted chalcone derivative; an oxazole derivative; a styrylanthracene derivative; a fluorenone derivative; a hydrazone derivative; a stilbene derivative; hydrogenated amorphous silicon; hydrogenated amorphous silicon carbide; zinc sulfide, and zinc selenide.

When a voltage is applied with the first electrode 62*fe* and a second electrode 68*se*, the light-emitting layer 66*le* recombines the holes injected from the first electrode 62*fe* and the electrons injected from the second electrode 68*se* to emit light. The light-emitting layer 66*le* is formed of a different material, depending on, for example, a color (red, green, or blue) of the light to be emitted from the organic EL element 70 of an individual subpixel Sp.

Exemplary materials of the light-emitting layer 66*le* include: a metal oxinoid compound [8-hydroxyquinoline metal complex]; a naphthalene derivative; an anthracene derivative; a diphenylethylene derivative; a vinylacetone derivative; a triphenylamine derivative; a butadiene derivative; a coumarin derivative; a benzoxazole derivative; an oxadiazole derivative; an oxazole derivative; a benzimidazole derivative; a thiadiazole derivative; a benzothiazole derivative; a styryl derivative; a styrylamine derivative; a bisstyrylbenzene derivative; a trisstyrylbenzene derivative; a perylene derivative; a perinone derivative; an aminopyrene derivative; a pyridine derivative; a rhodamine derivative; an aquizine derivative; phenoxazone, a quinacridone derivative; rubrene; poly-p-phenylenevinylene, and polysilane.

The electron transport layer 66*et* efficiently moves the electrons to the light-emitting layer 66*le*. Exemplary materials of the electron transport layer 66*et* include: an oxadiazole derivative; a triazole derivative; a benzoquinone derivative; a naphthoquinone derivative; an anthraquinone derivative; a tetracyanoanthraquinodimethane derivative; a diphenoquinone derivative; a fluorenone derivative; a silole derivative; and a metal oxinoid compound.

The electron injection layer 66*ei* is also referred to as an anode buffer layer. The electron injection layer 66*ei* brings energy levels of the second electrode 68*se* and the organic EL layer 66 closer to each other to improve efficiency in injection of the electrons from the second electrode 68*se* to the organic EL layer 66. Exemplary materials of the electron injection layer 66*ei* include: inorganic alkali compounds such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$); and strontium oxide (SrO).

The fifth conductive layer 68 includes the second electrode 68*se*. The second electrode 68*se* is monolithically provided in common to the plurality of subpixels Sp. The second electrode 68*se* is provided on the organic EL layer 66, and covers the edge cover 64*ec*. The second electrode 68*se* overlaps with the first electrodes 62*fe* through the organic EL layer 66. The second electrode 68*se* functions as a cathode to inject the electrons into the organic EL layer 66. The second electrode 68*se* is transparent to light.

Exemplary materials of the second electrode 68*se* include: silver (Ag); aluminum (Al); vanadium (V); calcium (Ca); titanium (Ti); yttrium (Y); sodium (Na); manganese (Mn); indium (In); magnesium (Mg); lithium (Li); ytterbium (Yb); and lithium fluoride (LiF).

Furthermore, the second electrode 68*se* may be formed of an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), or lithium fluoride (LiF)/calcium (Ca)/aluminum (Al).

Organic EL Layer

The organic EL elements 70 are provided for the respective subpixels Sp. Any of the plurality of organic EL elements 70 is a top-emission organic EL element. Each of the organic EL elements 70 has the first electrode 62*fe*, the organic EL layer 66, and the second electrode 68*se*. The organic EL element 70 emits light in a region corresponding to the opening 64*eo* of each edge cover 64*ec*. The region included in a subpixel Sp and corresponding to the opening 64*eo* of the edge cover 64*ec* is the light-emitting region E. The organic EL layer 66 emits light when a current is applied between the first electrode 62*fe* and the second electrode 68*se*.

Each first electrode 62*fe* is connected to the drain electrode 36*de* of a predetermined TFT50 (a third TFT50C) in the corresponding subpixel Sp, through a contact hole 38*h* formed in the planarization film 38*pf*. The organic EL layer 66 is sandwiched between the first electrode 62*fe* and the second electrode 68*se*. The second electrode 68*se*, which extends to the picture-frame region F, is connected to the second picture-frame wire 36*fb* in one of, or both, between the planarization film 38*pf* and the first dam wall Wa and between the first dam wall Wa and the second dam wall Wb.

Pixel Circuit

Figure 6:
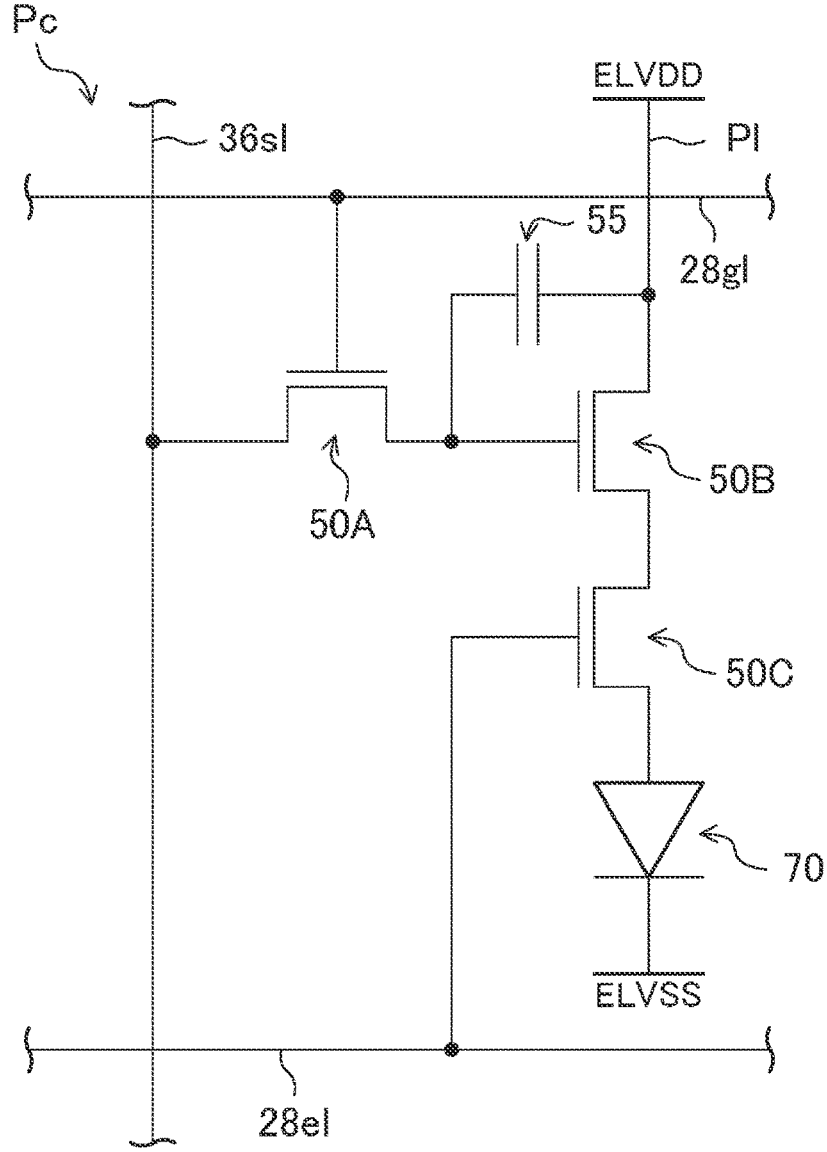
FIG. 6 is an equivalent circuit diagram illustrating a pixel circuit of the organic EL display device.

The plurality of TFTs 50, a capacitor 77, and the organic EL element 70 are provided for each of the subpixels Sp, and constitute a pixel circuit Pc as illustrated in FIG. 6. The pixel circuit Pc controls light to be emitted from the organic EL element 70 in the light-emitting region E of the corresponding subpixel Sp, in accordance with: a gate signal to be supplied to a gate wire 28*gl*; an emission signal to be supplied to an emission control wire 28*el*; a source signal to be supplied to a source wire 36*sl*; the high-level power source voltage (ELVDD) to be supplied to the power source wire Pl; and the low-level power source voltage (ELVSS) to be supplied to the second electrode 68*se*.

The plurality of TFTs 50 constituting the pixel circuit Pc include: a first TFT 50A; a second TFT 50B; and a third TFT 50C. In each subpixel Sp, the first TFT 50A is connected to the corresponding gate wire 28gl, source wire 36sl, and second TFT 50B. In each subpixel Sp, the second TFT 50B is connected to the corresponding first TFT 50A, power source wire Pl, and third TFT 50C. In each subpixel Sp, the third TFT 50C is connected to the corresponding second TFT 50B, emission control wire 28el, and organic EL element 70. In each subpixel Sp, the capacitor 55 is connected to the corresponding first TFT 50A, second TFT 50B, and power source wire Pl.

Sealing Film

The sealing film 80 is provided on the light-emitting element layer 60 to cover the plurality of organic EL elements 70. The sealing film 80 protects the organic EL layer 66 of each organic EL element 70 from, for example, water and oxygen. The sealing film 80 includes: a first inorganic sealing layer 82; an organic sealing layer 84; and a second inorganic sealing layer 86, all of which are provided in the stated order above the light-emitting element layer 60.

The first inorganic sealing layer 82 covers: the second electrode 68se in the display region D; and the first dam wall Wa and the second dam wall Wb in the frame region F. The first inorganic sealing layer 82 extends toward an outer periphery of the second dam wall Wb. The first inorganic sealing layer 82 further covers the third dam wall Wc in the non-display region N, and extends toward an inner periphery of the third dam wall Wc.

The organic sealing layer 84 is provided on the first inorganic sealing layer 82. The organic sealing layer 84 is provided behind the first dam wall Wa and out of the third dam wall Wc. The organic sealing layer 84 may also be provided between the first dam wall Wa and the second dam wall Wb. The organic sealing layer 84 is wrapped with, and contained between, the first inorganic sealing layer 82 and the second inorganic sealing layer 86.

The second inorganic sealing layer 86 covers the organic sealing layer 84, and extends toward an outer periphery of the second dam wall Wb and the inner periphery of the third dam wall Wc. A peripheral edge portion of the second inorganic sealing layer 86 overlaps with, and joins, a peripheral edge portion of the first inorganic sealing layer 82, toward an outer periphery of the first dam wall Wa and the inner periphery of the third dam wall Wc.

Each of the first inorganic sealing layer 82 and the second inorganic sealing layer 86 is formed of at least one inorganic insulating material selected from, for example, silicon oxide, silicon nitride, and silicon oxynitride. The organic sealing layer 84 is formed of at least one organic insulating material selected from, for example, acrylic resin, epoxy resin, silicone resin, polyurea resin, parylene resin, polyimide resin, and polyamide resin.

To a surface of the organic EL display device 1, such panels as a touch panel and a protection panel (not shown) are attached through an optical adhesive material 90 referred to as an optical clear adhesive (OCA) provided on the sealing film 80. The through hole H of the non-display region N is formed in the first resin substrate layer 12 and the inorganic substrate layer 14 of the substrate layer 10, and in the optical adhesive material 90.

Configuration of Non-Display Region

Figure 7:
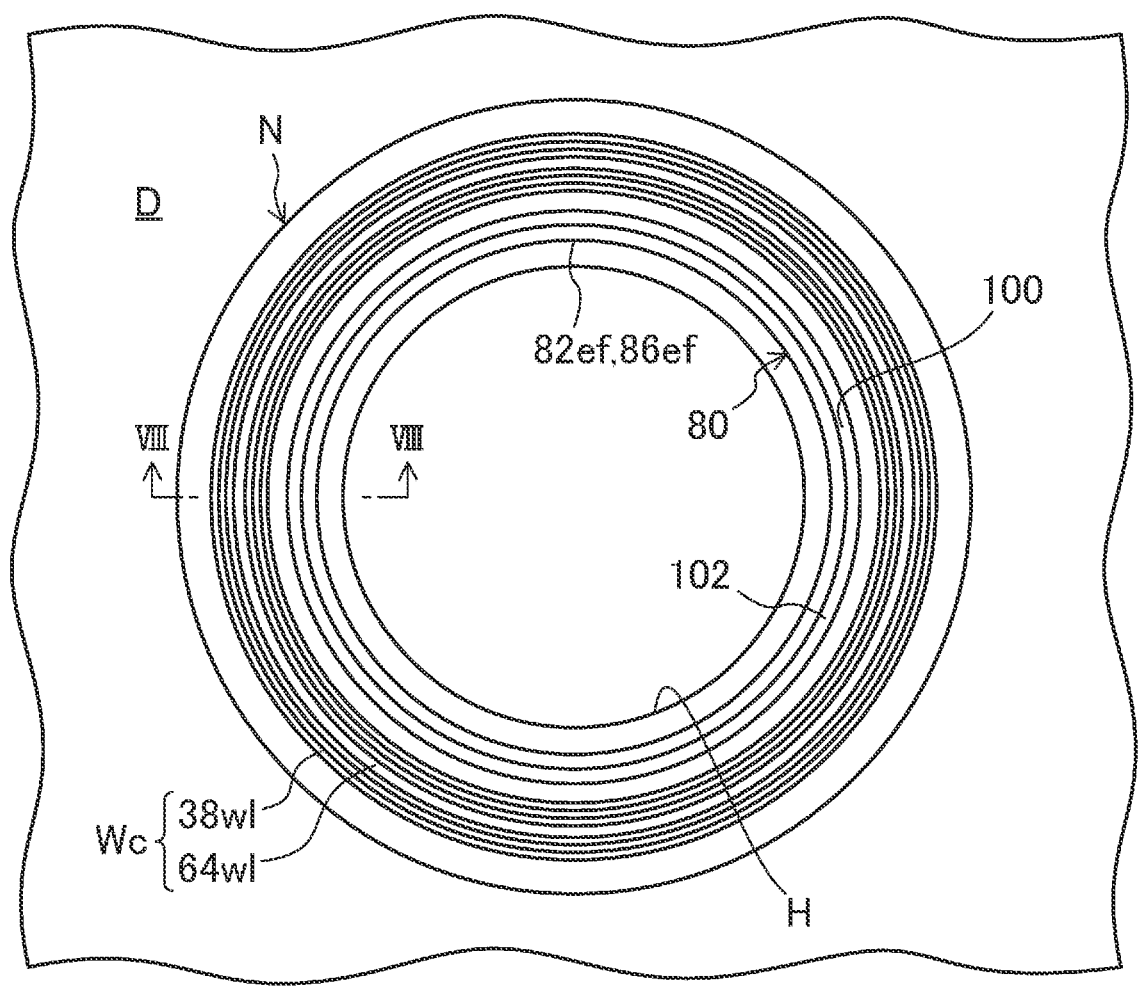
FIG. 7 is a plan view of, and around, a non-display region of the organic EL display device.
Figure 8:
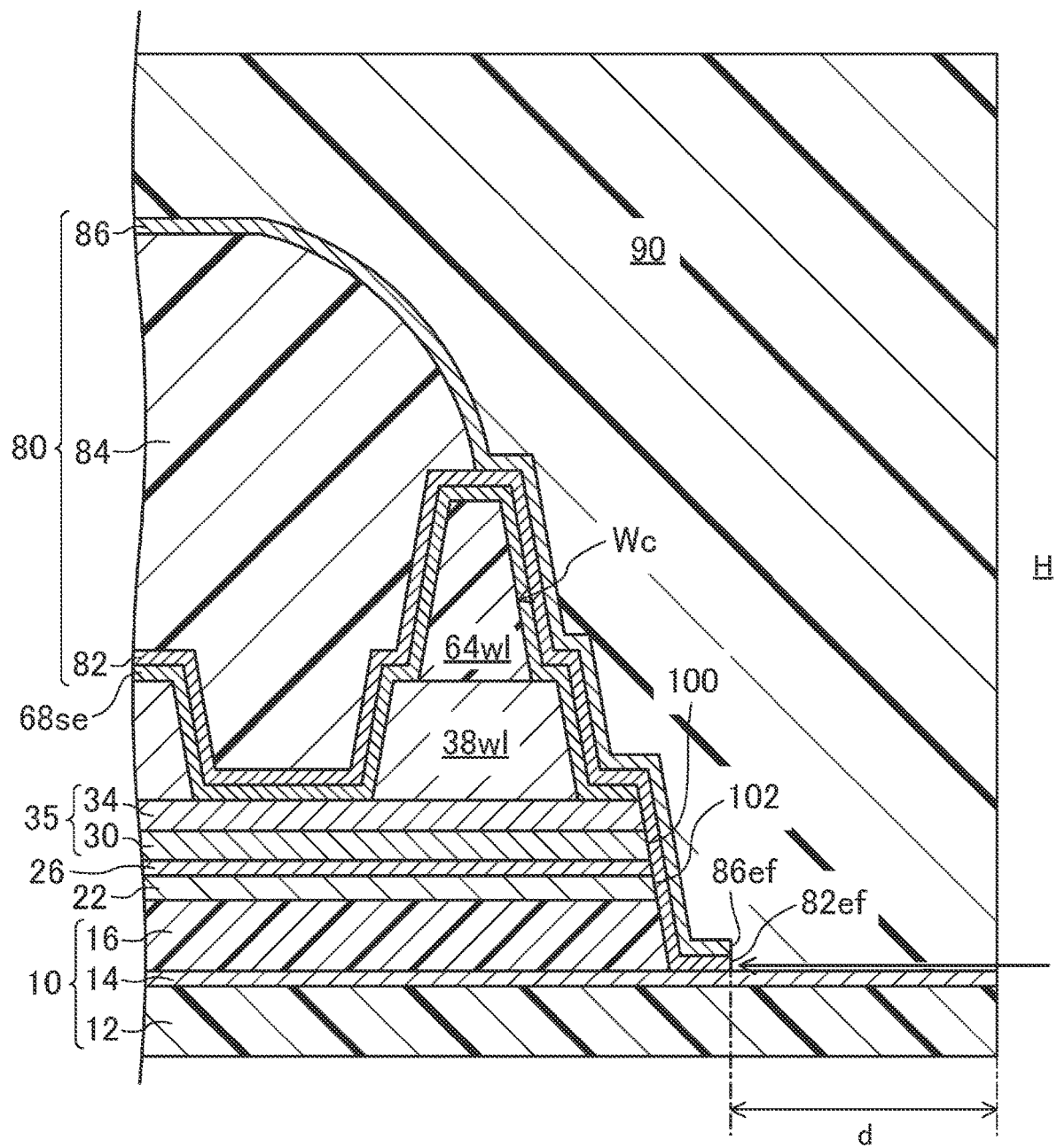
FIG. 8 is a cross-sectional view of the organic EL display device, taken along line VIII-VIII in FIG. 7.

As illustrated in FIGS. 7 and 8, in the non-display region N, the through hole His formed in a multilayer stack made of: the second resin substrate layer 16; the base coat film 22; the gate insulating film 26; the first interlayer insulating film 30; and the second interlayer insulating film 34. Around the through hole H, a recess portion 100 is formed into an annular shape to expose the inorganic substrate layer 14 on a bottom of the recess portion 100. The multilayer stack has an end face facing inside the recess portion 100. The end face includes an inclined end face 102 inclined and positioned closer to the through hole H toward the inorganic substrate layer 14. The inside of the recess portion 100 is open toward the through hole H.

The second electrode 68se is provided outside, but not inside, the recess portion 100. The third dam wall Wc is provided on an outer periphery of the recess portion 100 (a peripheral edge portion of an opening of the recess portion 100). Thus, the organic sealing layer 84 is provided only outside the recess portion 100. That is, the organic sealing layer 84 is not provided inside the recess portion 100. On the other hand, the first inorganic sealing layer 82 and the second inorganic sealing layer 86 are provided into the recess portion 100.

The first inorganic sealing layer 82 extends from the display region D into the recess portion 100 to cover the inclined end face 102 in the non-display region N, and comes into contact with the inorganic substrate layer 14 in the recess portion 100. Specifically, the first inorganic sealing layer 82 extends from the inclined end face 102 of the multilayer stack to the surface of the inorganic substrate layer 14 in the recess portion 100. Then, the first inorganic sealing layer 82 comes into contact with the inorganic substrate layer 14 on the outer periphery bottom of the recess portion 100. The second inorganic sealing layer 86 is provided on a surface of the first inorganic sealing layer 82 behind the third dam wall Wc.

The first inorganic sealing layer 82 has an end face 82ef toward the through hole H. The second inorganic sealing layer 86 has an end face 86ef toward the through hole H. The end faces 82ef and 86ef are positioned apart from the peripheral edge of the through hole H toward the display region D. The end face 82ef of the first inorganic sealing layer 82 toward the through hole H and the end face 86ef of the second inorganic sealing layer 86 toward the through hole H are formed flush with each other (positioned to form a single end face) in a thickness direction of the substrate layer 10. A distance d between the end faces 82ef and 86ef of the first inorganic sealing layer 82 and the second inorganic sealing layer 86 toward the through hole H and the peripheral edge of the through hole H, that is, the distance d from an end face of the sealing film 80 facing the through hole H to the peripheral edge of the through hole H is, for example, 600 µm or more and 800 µm or less.

Operation of Organic EL Display Device

In each subpixel Sp of the organic EL display device 1, first, a corresponding emission control wire 28el is selected and deactivated, and the organic EL element 70 is in a non-light-emitting state. Then, when a gate wire 28gl corresponding to the organic EL element 70 in the non-light-emitting state is selected, and the gate wire 28gl is activated, a gate signal is input through the gate wire 28gl to the first TFT 50A. Then, the first TFT 50A turns ON. When the first TFT 50A turns ON, a predetermined voltage, which corresponds to a source signal to be transmitted through a source wire 36sl, is applied to the second TFT 50B and written into the capacitor 55.

Then, when the emission control wire 28*el* is not selected, and thus is deactivated, an emission signal is input to the third TFT 50C through the emission control wire 28*el*, and the third TFT 50C turns ON. When the third TFT 50C turns ON, a current corresponding to a gate voltage of the second TFT 50B is supplied from a power source line Pl to the organic EL element 70. Thus, each organic EL layer 66 (the light-emitting layer 66*le*) emits light, and an image is displayed. Note that, even if the first TFT 9A turns OFF, the gate voltage of the second TFT 9B is held in the capacitor 55. Hence, each subpixel Sp allows the organic EL layer 66 to keep emitting light until a gate signal in a succeeding frame is input.

Method for Producing Organic EL Display Device

Figure 9:
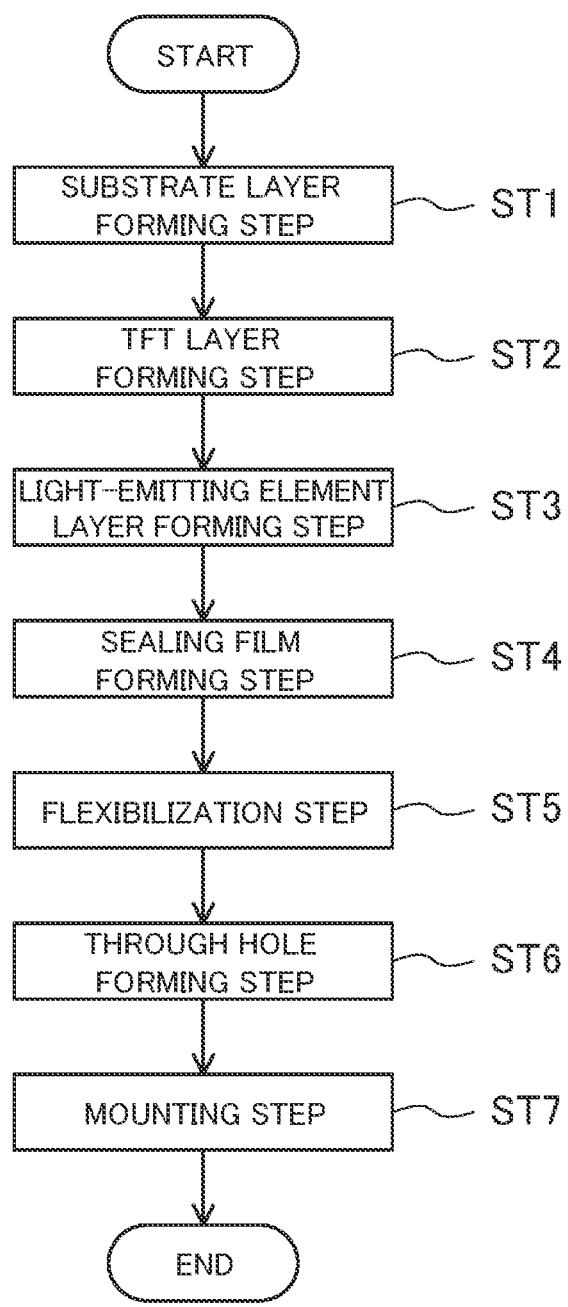
FIG. 9 is a schematic flowchart showing a method for producing the organic EL display device.

Described below is a method for producing the organic EL display device 1 according to this embodiment. As shown in FIG. 9, the method for producing the organic EL display device 1 includes: a substrate layer forming step ST1; a TFT layer forming step ST2; a light-emitting element layer forming step ST3; a sealing film forming step ST4; a flexibilization step ST5; a through hole forming step ST6; and a mounting step ST7.

Substrate Layer Forming Step

At the substrate layer forming step ST1, first, a glass substrate is coated with a non-photosensitive polyimide resin (approximately 2 μm in thickness). Furthermore, the coating film is prebaked and postbaked. Hence, the first resin substrate layer 12 is formed.

Next, on the substrate on which the first resin substrate layer 12 is formed, an inorganic insulating film (approximately 600 nm in thickness) such as a silicon oxide film is deposited by, for example, plasma chemical vapor deposition (CVD). Hence, the inorganic substrate layer 14 of the substrate layer 10 is formed.

Next, the substrate on which the inorganic substrate layer 14 is formed is coated with a non-photosensitive polyimide resin (approximately 2 μm in thickness). Furthermore, the coating film is prebaked and postbaked. Hence, the second resin substrate layer 16 is formed. This is how the substrate layer 10 is formed.

TFT Layer Forming Step

At the TFT layer forming step ST2, on the substrate on which the substrate layer 10 is formed, an inorganic insulating film (approximately 1000 nm in thickness) such as a silicon oxide film is deposited by, for example, the plasma CVD. Thus, the base coat film 22 is formed.

Next, on the substrate on which the base coat film 22 is formed, an amorphous silicon film (approximately 50 nm in thickness) is deposited by, for example, the plasma CVD. Then, the amorphous silicon film is crystallized by such a technique as laser annealing to form a semiconductor film made of polysilicon. Furthermore, the semiconductor film is patterned to form the plurality of semiconductor layers 24.

Next, on the substrate on which the semiconductor layers 24 is formed, an inorganic insulating film (approximately 100 nm in thickness) such as a silicon oxide film is deposited by, for example, the plasma CVD. Thus, the gate insulating film 26 is formed to cover the plurality of semiconductor layers 24.

Furthermore, on the gate insulating film 26 of the substrate, an aluminum film (approximately 350 nm in thickness) and a molybdenum nitride film (approximately 50 nm in thickness) are sequentially deposited by, for example, sputtering. Moreover, these metal films stacked on top of another are patterned to form the first conductive layer 28 including, for example, the plurality of gate wires 28*gl*.

Then, using the first conductive layer 28 as a mask, the semiconductor layers 24 are doped with impurity ions. Thus, each of the semiconductor layers 24 is provided with an intrinsic region and a conductor region.

Next, on each of the semiconductor layers 24 included in the substrate and provided with the intrinsic region and the conductor region, an inorganic insulating film (approximately 500 nm in thickness) such as a silicon oxide film is deposited by, for example, the plasma CVD. Thus, the first interlayer insulating film 30 is formed.

Furthermore, on the first interlayer insulating film 30 of the substrate, an aluminum film (approximately 350 nm in thickness) and a molybdenum nitride film (approximately 50 nm in thickness) are sequentially deposited by, for example, sputtering. Moreover, these metal films stacked on top of another are patterned to form the second conductive layer 32 including, for example, the plurality of first power source wires 32*pl*.

Next, on the substrate on which the second conductive layer 32 is formed, an inorganic insulating film (approximately 500 nm in thickness) such as a silicon oxide film is deposited by, for example, the plasma CVD. Thus, the second interlayer insulating film 34 is formed to constitute the interlayer insulating film 35.

After that, in the display region D, the gate insulating film 26 and the interlayer insulating film 35 (the first interlayer insulating film 30 and the second interlayer insulating film 34) are patterned. Thus, the contact hole 35*h* is formed. Furthermore, in the folding portion B, the base coat film 22, the gate insulating film 26, and the interlayer insulating film 35 are removed. Thus, the slit S1 is formed. Moreover, in the non-display region N, the base coat film 22, the gate insulating film 26, the interlayer insulating film 35, and the second resin substrate layer 16 are removed. Thus, the recess portion 100 is formed.

Next, the contact hole 35*h*, the slit S, and the recess portion 100 of the substrate are coated with, for example, a photosensitive polyimide resin. Furthermore, the coating film is prebaked, exposed to light, developed, and postbaked. Thus, the filling layer F1 is formed in the slit S1 of the folding portion B.

After that, on the substrate on which the filling layer is formed, a titanium film (approximately 30 nm in thickness), an aluminum film (approximately 300 nm in thickness) and a titanium film (approximately 50 nm in thickness) are sequentially deposited by, for example, sputtering. Moreover, these metal films stacked on top of another are patterned to form the third conductive layer 36 including, for example, the plurality of source wires 36*sl*.

Then, the substrate on which the third conductive layer 36 is formed is coated with a photosensitive polyimide resin (approximately 2 μm in thickness) by, for example, spin coating or slit coating. Furthermore, the coating film is prebaked, exposed to light, developed, and postbaked. Thus, the planarization film 38*pf* and the first wall layer are formed. This is how the TFT layer 20 is formed.

Light-Emitting Element Layer Forming Step

At the light-emitting element layer forming step ST3, on the TFT layer 20 of the substrate, the fourth conductive layer 62 (the plurality of first electrodes 62*fe*), the second resin layer 64 (the edge cover 64ec, the photo spacer 64ps, and the second wall layer), the organic EL layer 66 (the hole injection layer 66hi, the hole transport layer 66ht, the light-emitting layer 66le, the electron transport layer 66et, and the electron injection layer 66ei), and the fifth conductive layer 68 (the second electrode 68se) are sequentially formed by a well-known technique. Here, the second electrode 68se in the non-display region N is formed only outside the recess portion 100. Thus, the light-emitting element layer 60 is formed.

Sealing-Film Forming Step

At the sealing film forming step ST4, on the substrate on which the light-emitting element layer 60 is formed, a plurality of inorganic insulating films such as a silicon nitride film (approximately 200 nm in thickness) and a silicon oxide film (approximately 1000 nm in thickness) are sequentially deposited by, for example, the plasma CVD. Thus, the first inorganic sealing layer 82 is formed.

Next, the substrate on which the first inorganic sealing layer 82 is formed is coated with an organic insulating material (approximately 5000 nm in thickness) by, for example, inkjet printing. The organic insulating material forms the organic sealing layer 84. Here, wetting and spreading of the organic insulating material is blocked by one of, or both, the first dam wall Wa and the second dam wall Wb, and by the third dam wall Wc. Thus, the organic sealing layer 84 is limitedly provided in a predetermined region.

After that, on the substrate on which the organic sealing layer 84 is formed, an inorganic insulating film (approximately 600 nm in thickness) such as a silicon nitride film is deposited by, for example, the plasma CVD. Thus, the second inorganic sealing layer 86 is formed. After that, both the first inorganic sealing layer 82 and the second inorganic sealing layer 86 are patterned. Thus, the first inorganic sealing layer 82 and the second inorganic sealing layer 86 are formed, so that outer peripheral end faces of the first inorganic sealing layer 82 and the second inorganic sealing layer 86 are spaced at a predetermined interval from the outer peripheral edge of the substrate layer 10, and the end faces 82ef and 86ef of the first inorganic sealing layer 82 and the second inorganic sealing layer 86 toward the through hole H are spaced at a predetermined interval from the peripheral edge of the through hole H to be formed later. This is how the sealing film 80 is formed.

Flexibilization Step

At the flexibilization step ST5, to the surface of the substrate on which the sealing film 80 is formed, a touch panel and a protection panel are attached through the optical adhesive material 90. After that, the glass substrate of the substrate layer 10 is irradiated with a laser beam, and removed from a lower surface of the substrate layer 10. Furthermore, after the glass substrate is removed from the lower surface of the substrate layer 10, a protective film is attached to the lower surface.

Through Hole Forming Step

At the through hole forming step ST6, the through hole H is formed in the non-display region N of the substrate layer 10 from which the glass substrate is removed. The through hole H is formed with, for example, a laser beam emitted circularly to the substrate layer 10. Here, the first resin substrate layer 12 and the inorganic substrate layer 14 of the substrate layer 10 are exposed inside the through hole H. However, the first inorganic sealing layer 82 and the second inorganic sealing layer 86 forming the sealing film 80 are spaced apart from the periphery of through hole H. That is why the first inorganic sealing layer 82 and the second inorganic sealing layer 86 are not exposed inside the through hole H.

Mounting Step

At the mounting step ST7, the wiring board Cb is connected to the terminal unit T of the substrate in which the through hole H is formed, using a conductive material such as an anisotropic conductive film (ACF) or an anisotropic conductive paste (ACP). Hence, as the wiring board Cb and the terminal unit T are electrically continuous, the wiring board Cb and an external circuit such as a display control circuit are mounted.

After that, the organic EL display device 1 is housed in a casing together with the electronic component Ec such as a camera. The electronic component is installed in a region overlapping with the non-display region N (strictly, a region corresponding to the through hole) in plan view in back of the organic EL display device 1.

As described above, the organic EL display device 1 is successfully produced.

Features of Embodiment

In the organic EL display device 1 of this embodiment, the first inorganic sealing layer 82 included in the sealing film 80: extends from the display region D into the recess portion 100 to cover the inclined end face 102 in the non-display region N; and comes into contact with the inorganic substrate layer 14 inside the recess portion 100. The end face 82ef of the first inorganic sealing layer 82 toward the through hole H is positioned apart from the peripheral edge of the through hole H. Thus, the sealing film 80 has an end positioned away from the peripheral edge of the through hole H. Furthermore, the first inorganic sealing layer 82, which is included in the sealing film 80, and the inorganic substrate layer 14 are preferably joined together as inorganic insulating materials. Hence, even if water enters as indicated by an arrow in FIG. 8 at the through hole H formed in the non-display region N, the above features can reduce a possible risk of the water entering the display region D along the edge of the sealing film 80, specifically, between the first inorganic sealing layer 82 and the inorganic substrate layer 14. As a result, the features can reduce deterioration of the organic EL element 70 caused by the water entering the display region D.

Furthermore, in the organic EL display device 1, if a reverse-tapered partition wall as in the related art is provided around the through hole H, the partition wall might keep the first inorganic insulating layer 82 and the second inorganic sealing film 86, which are relatively thin layers included in the sealing film 80, from preferably covering a layer below. This is referred to as a coverage failure. When the coverage failure occurs, water enters the display region D at the coverage failure, possibly causing deterioration of the organic EL element 70. On the other hand, the organic EL display device 1 of this embodiment does not have a reverse-tapered partition wall. Such a feature can significantly reduce the risk that the sealing film 80 might suffer the coverage failure. The feature can reduce deterioration of the organic EL element 70. Thus, the organic EL display device 1 can improve its reliability.

Modification

Figure 10:
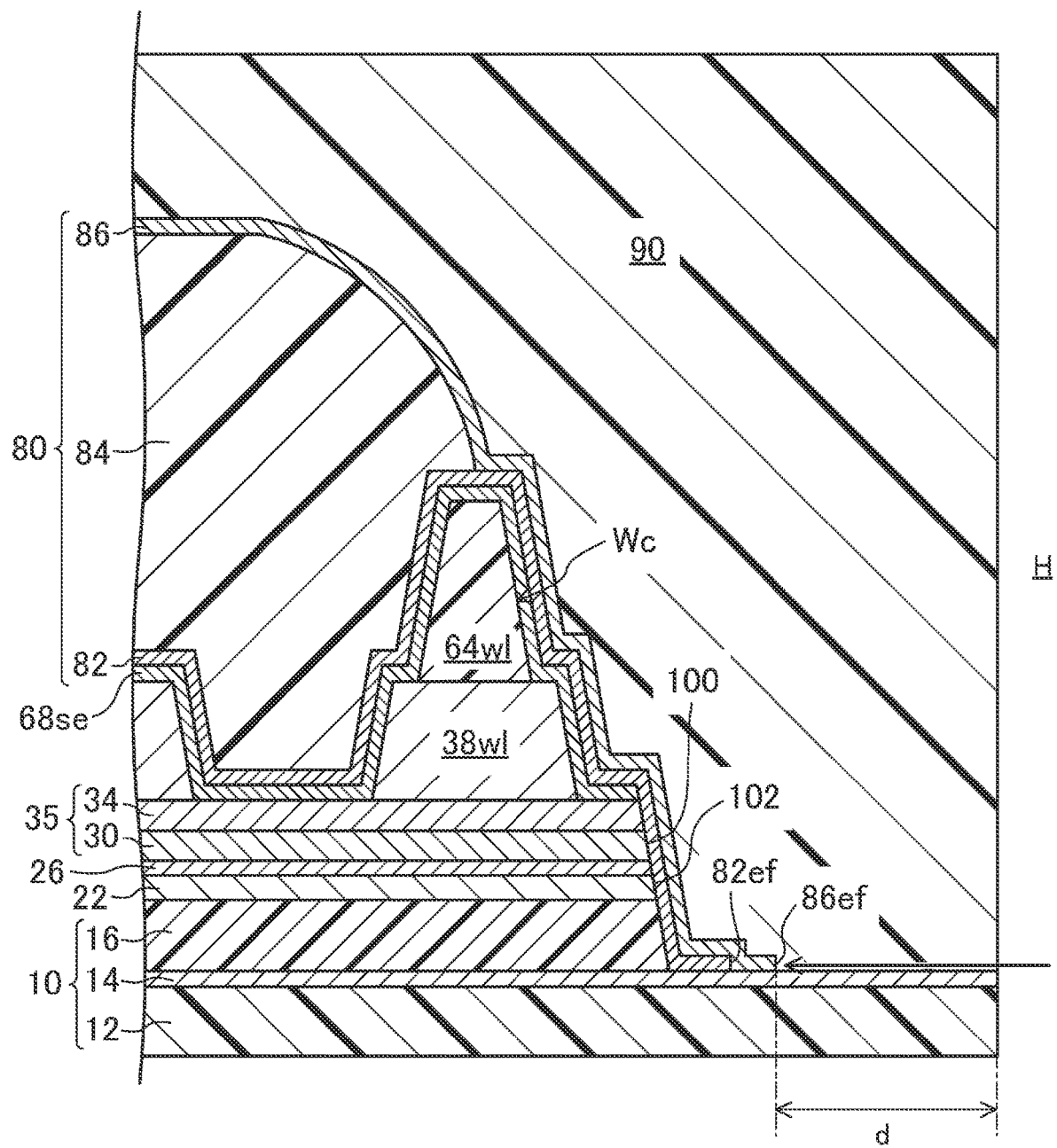
FIG. 10 is a cross-sectional view of the organic EL display device according to a modification.

In the above embodiment, both the end face 82*ef* and the end face 86*ef* of the first inorganic sealing layer 82 and the second inorganic sealing layer 86 included in the sealing film 80 are formed flush with each other toward the through hole H. On the other hand, as illustrated in FIG. 10, this modification is the same as the embodiment in that the first inorganic sealing layer 82 extends from the inclined end face 102 of the second resin substrate layer 1686 to the surface of the inorganic substrate layer 14 in the recess portion 100. However, in this modification, the second inorganic sealing layer 86 covers the end face 82*ef* of the first inorganic sealing layer 82 toward the through hole H, and comes into contact with the inorganic substrate layer 14 toward the through hole H with respect to the end face 82*ef* of the first inorganic sealing layer 82. In order to produce the organic EL display device 1, the first inorganic sealing layer 82 and the second inorganic sealing layer 86 may be separately patterned at the sealing film forming step ST4.

According to the organic EL display device 1 of this modification, the second inorganic sealing layer 86, as well as the first inorganic sealing layer 82, is preferably joined to the inorganic substrate layer 14. Hence, even if water enters as indicated by an arrow in FIG. 10 at the through hole H formed in the non-display region N, the modification can further reduce a possible risk of the water entering the display region D along the edge of the sealing film 80. Thus, the modification achieves an advantageous effect to reduce deterioration of the organic EL element 70 and improving reliability of the organic EL display device 1.

Other Embodiments

In the above embodiment, the organic EL layer 66 is individually provided for, but not limited to, each subpixel Sp. The organic EL layer 66 may be provided monolithically in common to a plurality of subpixels Sp. In this case, the organic EL display device 1 may include, for example, a color filter so that each of the subpixels Sp presents a color tone.

In the above embodiment, each pixel Px includes subpixels Sp presenting, but not limited to, three colors. The colors of the subpixels Sp included in each pixel Px are not limited to three colors. The colors may be four or more colors. Furthermore, the subpixels Sp included in each pixel Px and presenting three colors are arranged in, but not limited to, stripes. The plurality of subpixels Sp may be arranged in another manner such as PenTile Matrix.

In the above embodiment, all of the first TFT 50A, the second TFT 50B, and the third TFT 50C are, but not limited to, top-gate TFTs, the first TFT 50A, the second TFT 50B, and the third TFT 50C may be bottom-gate TFTs. Moreover, each subpixel Sp may include two TFTs, or four or more TFTs.

In the above embodiment, the first electrode 62*fe* and the second electrode 68*se* are respectively, but not limited to, an anode and a cathode. The first electrode 62*fe* may be a cathode, and the second electrode 68*se* may be an anode. In this case, the organic EL layer 66 has an inverted multilayer structure.

In the above embodiment, the organic EL layer 66 have, but not limited to, a five-layer structure including the hole injection layer 66*hi*, the hole transport layer 66*ht*, the light-emitting layer 66*le*, the electron transport layer 66*et*, and the electron injection layer 66*ei*. The organic EL layer 66 may have a three-layer structure including a hole injection and transport layer, the light-emitting layer 66*le*, and an electron transport and injection layer. The organic EL layer 66 can have any given structure.

In the above embodiments, the example of the display device is, but not limited to, the organic EL display device 1. A technique of the present disclosure is applicable to, for example, a display device including a plurality of light-emitting elements driven by a current. Examples of such a display device include a display device provided with quantum-dot light-emitting diodes (QLEDs); that is, light-emitting elements including layers containing quantum dots.

As can be seen, preferred embodiments have been described as examples of the technique of the present disclosure. However, the technique of the present disclosure shall not be limited to the above examples. The technique is applicable to embodiments with appropriate modifications such as changes, substitutions, additions, and omissions of features. Furthermore, the constituent features in the accompanying drawings and the detailed description may include a constituent feature not essential to solution to a problem. Hence, it should not be interpreted that the non-essential constituent feature is immediately rendered essential just because such a constituent feature is found in the accompanying drawings or the detailed description.

INDUSTRIAL APPLICABILITY

As described above, the technique of the present disclosure is useful for a display device.

The invention claimed is:

1. A display device, comprising:
  a substrate layer including an inorganic substrate layer and a resin substrate layer provided on the inorganic substrate layer;
  a light-emitting element layer provided above the resin substrate layer and including a plurality of light-emitting elements;
  a sealing film including an inorganic sealing layer provided to cover the plurality of light-emitting elements;
  a display region configured to display an image with light emitted from the light-emitting elements, and a non-display region positioned inside the display region and shaped into an island; and
  a through hole included in the non-display region and formed in a thickness direction of the substrate layer,
  wherein, in the non-display region, a recess portion is formed around the through hole of the resin substrate layer to expose the inorganic substrate layer on a bottom of the recess portion,
  the resin substrate layer has an end face facing inside the recess portion, the end face including an inclined end face inclined and positioned closer to the through hole toward the inorganic substrate layer,
  the inorganic sealing layer extends from the display region into the recess portion to cover the inclined end face in the non-display region, and comes into contact with the inorganic substrate layer in the recess portion, and
  the inorganic sealing layer has an end face toward the through hole, the end face being positioned apart from a peripheral edge of the through hole.

2. The display device according to claim 1,
  wherein the sealing film includes: a first inorganic sealing layer and a second inorganic sealing layer both of which function as the inorganic sealing layer; and an organic sealing layer provided between the first inorganic sealing layer and the second inorganic sealing layer.

3. The display device according to claim 2, wherein the organic sealing layer is provided only outside the recess portion.

4. The display device according to claim 2, wherein an end face of the first inorganic sealing layer toward the through hole and an end face of the second inorganic sealing layer toward the through hole are formed flush with each other.

5. The display device according to claim 2, wherein the first inorganic sealing layer is positioned below the second inorganic sealing layer, and extends from the inclined end face of the resin substrate layer to a surface of the inorganic substrate layer in the recess portion, and
the second inorganic sealing layer covers an end face of the first inorganic sealing layer toward the through hole, and comes into contact with the inorganic substrate layer toward the through hole with respect to the end face of the first inorganic sealing layer.

6. The display device according to claim 1, wherein a distance between an end face of the inorganic sealing layer toward the through hole and a peripheral edge of the through hole is 600 μm or more and 800 μm or less.

7. The display device according to claim 1, wherein each of the inorganic sealing layer and the inorganic substrate layer is formed of at least one inorganic material selected from silicon oxide, silicon nitride, and silicon oxynitride.

8. The display device according to claim 1, wherein each of the plurality of light-emitting elements includes: a first electrode; a light-emitting functional layer provided on the first electrode; and a second electrode provided on the light-emitting functional layer.

9. The display device according to claim 8, wherein the light-emitting functional layer is an organic electroluminescence layer configured to emit light when a current is applied between the first electrode and the second electrode.

* * * * *